United States Patent
Homann et al.

(10) Patent No.: US 12,130,314 B2
(45) Date of Patent: Oct. 29, 2024

(54) METHOD AND APPARATUS FOR MONITORING OPERATIONAL INTEGRITY OF A SENSOR AND PROCESSING CHAIN

(71) Applicant: IAV GmbH Ingenieurgesellschaft Auto und Verkehr, Berlin (DE)

(72) Inventors: Michael Homann, Vordorf (DE); Matthias Krings, Ingolstadt (DE)

(73) Assignee: IAV GmbH Ingenieurgesellschaft Auto und Verkehr, Berlin (DE)

( * ) Notice: Subject to any disclaimer, the term of this patent is extended or adjusted under 35 U.S.C. 154(b) by 81 days.

(21) Appl. No.: 18/101,224

(22) Filed: Jan. 25, 2023

(65) Prior Publication Data
US 2023/0236228 A1    Jul. 27, 2023

(30) Foreign Application Priority Data
Jan. 27, 2022  (DE) .................. 10 2022 101 903.9

(51) Int. Cl.
*G01R 19/25* (2006.01)
*B60L 15/20* (2006.01)

(52) U.S. Cl.
CPC .............. *G01R 19/25* (2013.01); *B60L 15/20* (2013.01)

(58) Field of Classification Search
CPC ...... B60L 15/20; B60L 3/0038; B60L 3/0084; G01R 19/25; G01R 31/007; G01R 31/2829; G01R 35/005; G01R 23/02; G01R 25/00; G01R 31/001; G01R 31/3842; B60R 21/0153; B60R 21/01532
See application file for complete search history.

(56) References Cited

U.S. PATENT DOCUMENTS

| | | | |
|---|---|---|---|
| 4,023,098 A | 5/1977 | Roth | |
| 7,728,537 B2 * | 6/2010 | Tomigashi | H02M 7/217 318/432 |
| 8,635,033 B2 * | 1/2014 | Hasan | G01R 31/50 702/58 |

(Continued)

FOREIGN PATENT DOCUMENTS

| | | |
|---|---|---|
| CN | 104459590 A | 3/2015 |
| CN | 104181404 B | 6/2017 |

(Continued)

OTHER PUBLICATIONS

Isermann, R. (1992). Korrelationsanalyse mit zeitdiskreten Signalen. In: Identifikation dynamischer Systeme 1. Springer-Lehrbuch. Springer, Berlin, Heidelberg. pp. 178-183.

(Continued)

*Primary Examiner* — Vinh P Nguyen
(74) *Attorney, Agent, or Firm* — Smartpat PLC

(57) ABSTRACT

An improved monitoring of a measurement chain with a sensor is achieved by using a broadband test signal. Thereby, the entire frequency range of a sensor can be covered with one test signal. There is no need to switch between different test signals and the available time for a diagnostic run can be used optimally. The broadband test signal allows better separation of the test signal and the useful signal. The integrity of an AC current measurement is increased by this approach. This can simplify the monitoring of a DC current sensor or even eliminate the need for an additional DC current sensor. In both cases, cost savings can be achieved.

11 Claims, 3 Drawing Sheets

(56) References Cited

U.S. PATENT DOCUMENTS

| | | | |
|---|---|---|---|
| 9,150,108 B2* | 10/2015 | Wang | B60L 3/0069 |
| 9,310,456 B2* | 4/2016 | Lim | B60L 50/16 |
| 9,910,121 B2* | 3/2018 | Hwang | G01R 35/00 |
| 10,466,081 B2 | 11/2019 | Youssef | |
| 10,641,802 B2 | 5/2020 | Petrie et al. | |
| 10,794,940 B2* | 10/2020 | Busser | G01R 19/2513 |
| 2001/0012984 A1 | 8/2001 | Adamiak et al. | |
| 2006/0155511 A1 | 7/2006 | Steinmueller et al. | |
| 2006/0290341 A1 | 12/2006 | Hausperger et al. | |
| 2010/0145660 A1 | 6/2010 | Lang et al. | |
| 2012/0187884 A1 | 7/2012 | Gaiser et al. | |
| 2012/0319473 A1 | 12/2012 | Tzivanopoulos et al. | |
| 2014/0253102 A1 | 9/2014 | Wood et al. | |
| 2015/0061708 A1 | 3/2015 | Wang et al. | |
| 2015/0160298 A1 | 6/2015 | Tabatowski-Bush | |
| 2015/0253412 A1 | 9/2015 | Jost et al. | |
| 2016/0356820 A1 | 12/2016 | Ausserlechner | |
| 2019/0079117 A1 | 3/2019 | Hurwitz et al. | |

FOREIGN PATENT DOCUMENTS

| | | |
|---|---|---|
| CN | 104698252 B | 7/2019 |
| DE | 2637775 A1 | 3/1977 |
| DE | 158603 A1 | 1/1983 |
| DE | 10204425 A1 | 8/2003 |
| DE | 10302362 A1 | 1/2004 |
| DE | 69832980 | 7/2006 |
| DE | 69734818 | 8/2006 |
| DE | 102005024075 A1 | 11/2006 |
| DE | 102006048730 A1 | 5/2007 |
| DE | 102009047665 A1 | 7/2010 |
| DE | 102014216649 A1 | 3/2015 |
| DE | 102014200265 A1 | 7/2015 |
| DE | 102015103162 A1 | 9/2015 |
| DE | 102015015796 A1 | 8/2016 |
| DE | 102015109009 A1 | 12/2016 |
| DE | 102017117364 A1 | 2/2019 |
| DE | 102018123530 A1 | 3/2020 |
| DE | 102019008365 A1 | 6/2020 |
| DE | 102019201140 A1 | 7/2020 |
| EP | 2513655 A1 | 10/2012 |
| EP | 2460056 | 10/2013 |
| GB | 2253487 B | 8/1994 |
| WO | 2004025223 A3 | 10/2004 |
| WO | 2013017515 A1 | 2/2013 |
| WO | 2013038176 A2 | 3/2013 |

OTHER PUBLICATIONS

Müller, K. (1996). Normen für Signale und Systeme. In: Entwurf robuster Regelungen. Vieweg+Teubner Verlag, Wiesbaden. pp. 101-118. https://doi.org/10.1007/978-3-663-12091-9_7.

Schröder, D. (2015). Stromregelverfahren für Drehfeldmaschinen. In: Elektrische Antriebe—Regelung von Antriebssystemen. Springer Vieweg, Berlin, Heidelberg. pp. 633-637. https://doi.org/10.1007/978-3-642-30096-7_14.

* cited by examiner

METHOD AND APPARATUS FOR MONITORING OPERATIONAL INTEGRITY OF A SENSOR AND PROCESSING CHAIN

CROSS-REFERENCE TO RELATED APPLICATION

This application claims the benefit of German Patent Application No. 10 2022 101 903.9, filed 2022 Jan. 27, the contents of which is hereby incorporated by reference in its entirety.

TECHNICAL FIELD

The present disclosure relates to a method and a device for monitoring a sensor and processing chain, collectively referred to as a measurement chain.

BACKGROUND

The control of electrical drives requires the measurement of state variables such as current and angle as well as setting a voltage with an adjustable amplitude and frequency. This voltage is provided by a three-phase inverter with power switches and diodes. In order to regulate a three-phase electrical drive, such as an asynchronous machine or synchronous machine, the phase currents are transformed into a rotor- or flux-oriented coordinate system using two transformations. Due to the zero-current condition of the star connection, only two independent values have to be set. Due to the two transformations, these are DC quantities in steady-state operation. The current space vector of the electric drive is divided into the field-generating and the torque-generating component. For an asynchronous machine, a synchronous machine with buried magnets or a separately excited synchronous machine, the torque is formed from both components. The target values for field-forming and torque-forming current components are calculated from the target torque of the electric drive, mostly based on tables.

With regard to the use of electric drives in road-legal vehicles, suitable monitoring measures for torque control and generation must be introduced. It is customary in the industry for these monitoring measures to be designed, developed and secured according to the ISO26262 standard.

Typically, to monitor the torque control and generation, a comparison between the target and actual torque is introduced to a threshold value. This requires a calculation of the actual torque based on the state variables of the electric drive.

In the prior art, the actual torque is estimated by calculating the intermediate circuit current. For this purpose, either a direct measurement of the intermediate circuit current (DC current) can be used, or the intermediate circuit current can be calculated without an explicit sensor. With an ideal inverter, the DC link current $i_{WR}$ can be calculated by multiplying the duty cycle $u_{Tast,i}$ of a phase and the respective phase current $i_{S,i}$, as follows:

$$i_{WR} = u_{Tast,1} * i_{S,1} + u_{Tast,2} * i_{S,2} + u_{Tast,3} * i_{S,3}.$$

This is known, for example according to SCHRÖDER, D. (2015). Electrical Drives-Control of Drive Systems, 4th Edition. Springer Berlin Heidelberg.

Here, the respective phase current (AC current) is usually determined with the help of a current meter, consisting of a magnetically highly permeable toroidal core that encloses the power line. This bundles the magnetic field generated by the current and guides it through an air gap in the core. In the latter, the magnetic field, which is proportional to the current, can be measured using a Hall sensor. The measurement voltage generated by the Hall sensor thus corresponds to the current to be measured.

The integrity of this measurement with regard to the requirements of a functional safety standard is usually not sufficient for a one-sensor solution due to the operating principle and the individual components used within a Hall-based current sensor. An increased technical effort is therefore necessary in order to achieve the integrity required by the standards. In order to ensure the required integrity, it is necessary to increase diagnostic coverage by continuously monitoring the sensor.

According to the prior art, an additional DC current sensor is therefore added to the DC intermediate circuit for the purpose of correlating different measurement principles.

Current technical implementations also consist in checking the functionality of a current sensor before and/or during operation using diagnostic measures. According to EP 2 513 655 B1, for example, it is known to feed a narrow-band test signal into the magnetic field of the toroidal core of a current sensor, which is then evaluated on the sensor's output signal. This is how the processing chain behind it is tested.

The narrow-band test signal only covers a small frequency range of the sensor. Many narrow-band test signals must be used, to cover for example the frequency range (e.g., 0 Hz to 5 kHz) of a phase current sensor. The period of time to inject and evaluate all narrow-band test signals can be longer than the fault tolerant time interval of the safety target and can therefore take too long.

In operation, the narrow-band signal is also difficult to distinguish from the narrow-band useful signal of the application, here the fundamental of the particular electrical machine to be operated. Due to the superposition of test signal and useful signal, the effects can no longer be clearly separated. Separation can only take place when either the useful signal or the test signal is measured with other sensors.

SUMMARY

It is an object of the present disclosure to improve the monitoring of a sensor and processing chain. This object is achieved by a method and a device having the features according to the patent claims.

The basic idea is to use a broadband test signal. This means that the entire frequency range of a sensor can be covered with one test signal. There is no need to switch between different test signals and the available time for a diagnostic run can be used optimally. The broadband test signal also allows better separation of the test signal and the useful signal.

The integrity of an AC current measurement is increased. This can simplify the monitoring of a DC current sensor or even eliminate the need for an additional DC current sensor. In both cases, cost savings are possible.

Further advantageous refinements of the present invention can be found in the following exemplary embodiment and in the dependent patent claims. The following detailed description is merely exemplary in nature and is not intended to limit the invention or the application and uses of the invention. Furthermore, there is no intention to be bound by any theory presented in the preceding background or the following detailed description.

DETAILED DESCRIPTION

Figure 1:
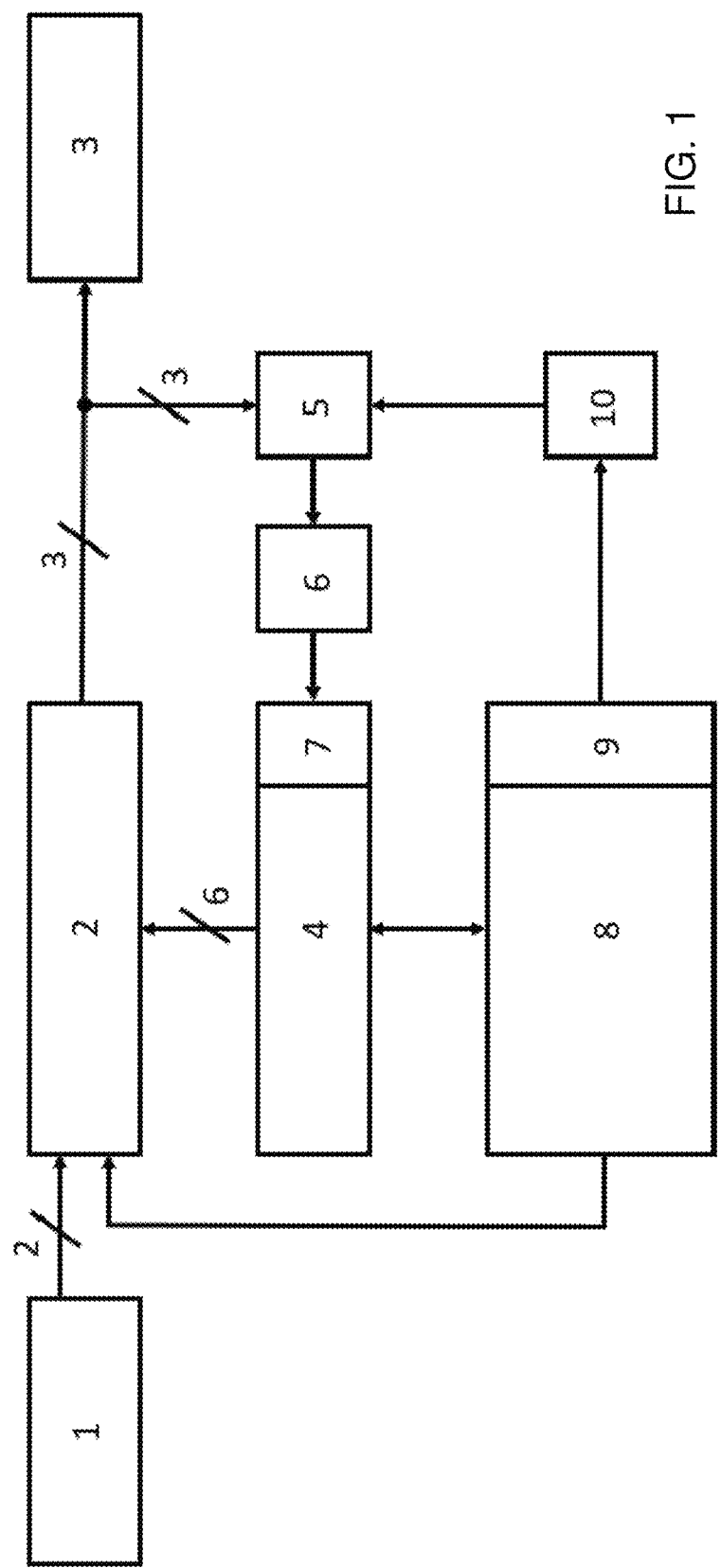
FIG. 1 illustrates a mechatronic system.

As shown in FIG. 1, a mechatronic system comprises, in addition to an electrical energy store 1, for example in the form of a high-voltage battery, a power converter or converter 2 and an electrical machine 3. The converter 2 is designed in particular as a B6 bridge inverter, as disclosed for example in DE 10 2018 123 530 A1 or DE 10 2017 117 364 A1. The electrical machine 3 is, for example, a permanently excited synchronous machine with three phases. The mechatronic system according to FIG. 1 preferably serves to drive a vehicle. The electric machine 3 is controlled or regulated by means of a microcontroller 4, i.e., a suitable control logic or gate drivers, in particular in connection with a pulse width modulator which provides or generates pulse width modulated (PWM) signals. The pulse width modulator provides six PWM signals so that the six power semiconductors of the power converter 2 are actuated in such a way that the level and frequency of the phase potentials or phase voltages can be set, and corresponding phase currents result.

Figure 2:
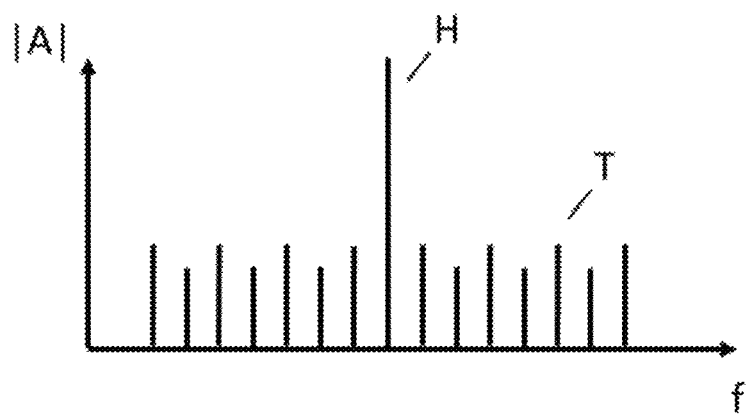
FIG. 2 shows a frequency/amplitude diagram.

As shown in FIG. 1, the phase currents are fed back for regulation. In this case, the phase currents are respectively detected by means of suitable current meter, i.e., current sensors 5. These current sensors 5 consist of a magnetically highly permeable toroidal core, which encloses the respective phase/power line. This bundles the magnetic field generated by the current and guides it through an air gap in the core. In the latter, the magnetic field, which is proportional to the current, can be measured using a Hall sensor. The measurement voltage generated by the Hall sensor thus corresponds to the current to be measured, see schematic representation in FIG. 2 according to EP 2 513 655 B1. Of course, the phase voltages can also be correspondingly measured and fed back or recorded. Information is thus available which represents the respective phase voltage or the phase current. This information is supplied to the control logic 4 or the pulse width modulator to form the PWM signals or the pulse duty factor of the respective phase. According to FIG. 1, the information or signals relating to the phase currents detected by means of the current sensors 5 are subjected to analog signal processing 6, in particular amplification (OPV), and then digitized by means of an analog-to-digital converter 7 (ADC) for further processing by means of the microcontroller 4. In FIG. 1, only one current sensor 5 is shown as an example; in practice one current sensor 5 is preferably provided for each of the three phases, with each individual current sensor 5 being monitored using the method according to the disclosure.

In summary, the control of electrical drives requires the measurement of state variables such as current and (mechanical rotation) angle (not shown in FIG. 1) and the generating of a voltage with adjustable amplitude and frequency.

A watchdog 8 monitors the correct functioning of the microcontroller 4, for example based on memory/arithmetic unit tests and can withdraw the release of the power electronics 2 in case of failed diagnostics. This watchdog 8 is also used to generate a test signal and to check through the interface to the microcontroller 4 (see double arrow in FIG. 1) whether the response of the measurement chain to the test signal is correct. The independent switch-off path enables redundant switch-off in the event of a fault in the measurement chain. The measurement chain includes the current sensors 5, the analog signal processing 6 or amplification and the analog-to-digital converter 7 (ADC) and the respective line connections.

The broadband test signal is generated with a noise generator 9 which is part of the watchdog 8 in particular. Binary noise generators requiring little implementation effort, such as e.g., PRBS (pseudorandom binary sequence), may be used. A driver stage 10, in particular with an additional winding connected thereto, injects this test signal as a real current in the sensor 5 to be monitored. The signal processing of the measured current values takes place in the microcontroller 4. To evaluate the test signals, norms of signals, for example as described in Müller, Kai: Entwurf robuster Regelungen (design of robust controls), page 101ff, are helpful because they map a signal curve, such as that created by excitation with a test signal, to a real, positive number. This number is preferably used as a representative number for the signal curve and can be exchanged between the microcontroller 4 and watchdog 8 much more easily than an entire signal curve. In particular, the 2-norm is of interest, which represents the energy content $\|u\|2$ of a signal u(t):

$$\|u\|_2 := \sqrt{\int_{-\infty}^{+\infty} u(t)^2 dt}.$$

Furthermore, the broadband test signal is now injected into the current sensor 5 to be monitored. In the specific case, it means that driver stage 10 drives the electrically amplified test signal onto a winding around the toroidal core of current sensor 5. In this way, the same mechanism of action (conductor in the toroidal core) of the useful signal is used.

The entire measurement chain with sensor(s) 5, electrical line connections, in particular existing analog signal processing 6 and in particular existing analog-to-digital conversion 7 is considered thereafter.

The aim of the test signal injection is a functional monitoring of a measurement chain, i.e., the aim is to discover random hardware faults in the measurement chain and to increase the integrity of the current measurement. The diagnostic method proposed here addresses the failure modes listed in the ISO26262 standard, with the diagnostic/monitoring method being used differently or individually in two phases, namely in a first phase during the start-up or booting of the microcontroller 4, i.e. the control unit, i.e. temporally before an operation and in a second phase during the operation of the microcontroller 4 or the underlying mechatronic system, in particular the drive system.

In the first phase, ie before or at the start of the microcontroller 4, i.e. before or during booting, when the system or the control unit is at rest and no currents flow through the phases or the conductors enclosed by the current sensors 5, which can be ensured by a suitable operating strategy, no test signal is generated or output by means of the watchdog 8 or the noise generator 9 or no test signal is impressed into the sensor 5 to be monitored in each case. However, the analog/digital converter 7 is clocked, i.e., it is in operation, as in the second phase, and (only) the noise of the measurement chain is measured. A norm of the measured values is now determined. This evaluates the effect/characteristics of the measurement chain in the idle state. For example, the inherent noise energy can be calculated by calculating the 2-norm (effective value) of the measured values. The test signal is now activated, in particular by means of the watchdog 8, and the measurement chain is excited over a wide band with a defined (frequency) spectrum (PRBS) and the resulting noise (sum of intrinsic noise and noise caused by the test signal) is measured. Using the microcontroller 4, a norm is calculated based on the measured values, for example the 2-norm. Then the norm, which was determined during the idle state of the measurement chain, is subtracted therefrom. This results in the actual norm or actual representative number. Finally, the actual representative number is compared with a target representative number or contrasted to it and a threshold value or several threshold values are used to decide whether a faulty or fault-free measurement chain is present, with a difference between the actual representative number and the target representative number being formed and processed further. That is, monitoring the measurement chain means in particular that a decision is made as to whether the measurement chain is faulty or free of faults.

For example, particularly as part of the development of the mechatronic system or during its calibration, an upper and lower limit or threshold is determined with regard to a deviation of the actual representative number from the target representative number. For this purpose, all possible single point failures of the components are considered, whereby the failure modes are applied individually and the deviation of the actual representative number from the target representative number for each individual failure mode is determined in simulation. Then the whole thing is repeated for dual point failures. According to ISO26262, this procedure is prescribed as part of a safety analysis even without this diagnosis. According to ISO26262, independent triple-point faults are considered safe, so the analysis can be stopped after the dual-point fault. The absolute minimum deviation in the positive and negative direction is determined from the discrepancies and, for example, the threshold value for a detected fault is set to half the absolute minimum discrepancy.

The target representative number is also determined as part of the development of the mechatronic system or during its calibration. This determination is therefore made once or only once. Either by means of a simulation or as part of an experiment, it is determined or ascertained how much energy flows through a fault-free or intact measurement chain (which of course otherwise, i.e. in particular with regard to the design or structure or the number of components used corresponds to the measurement chain to be monitored) is transmitted due to the excitation by means of the test signal or a test signal. That is, the noise or the response behavior is determined or calculated, i.e., the response of the error-free or intact measurement chain, either by way of a simulation or by way of an experiment or real trial. In the case of the simulation, a transfer function of the measurement chain must be determined, which contains or represents the component parameters of the measurement chain. This is possible according to the state of the art. This simulation can then also be validated with a test to determine whether the simulation or modeling is of sufficient quality. The norm, in particular the 2 norm, is calculated from the measured values in order to obtain a representative number. The target noise energy or target representative number of the norm is now fixed.

The overarching topic is therefore the generation of a test signal, in particular a white noise, as well as the excitation and evaluation of the response of the measurement chain.

In other words, in the first phase:
a) a determination or measurement of the existing noise or inherent noise of the measurement chain to be monitored, i.e. without the measurement chain being excited by a test signal, with the energy of the noise, i.e. the energy of the noise signal being determined or calculated in particular, for example by calculating a norm, in particular the 2-norm, so that a statement regarding the inherent noise energy of the measurement chain is available,
b) an excitation or injection of the measurement chain to be monitored with a broadband test signal (PRBS or "white noise") with a certain energy and measurement of the resulting excitation noise and calculation, based on the measured values, how much energy is generated due to the noise excitation in the measurement chain or calculation of a norm, in particular the 2-norm, based on the measured excitation noise values,
c) a subtraction of the inherent noise energy according to a) from the energy determined according to b) in connection with a noise excitation, in such a way or that an actual representative number or actual norm of the resulting corrected excitation noise is available for further processing,
d) a determination or establishment of a target representative number or target norm as part of the development of the mechatronic system or during its calibration, with a transfer function of the error-free measurement chain being used to calculate how much energy is theoretically transmitted via the (error-free) measurement chain for a specific excitation using a test signal (in particular, of course, the test signal according to b) or a matching or a sufficiently identical test signal), with this simulation being adjusted if necessary by means of tests, alternatively, instead of the simulation or calculation, this determination can also take place based on an experiment, i.e. the determination of the noise of the (fault-free) measurement chain, which results as a result of an excitation of the fault-free measurement chain with the test signal according to b) or, alternatively, an experiment can be used to determine the target representative number, target norm or energy, wherein the experiment is used to determine how much energy is transmitted over the real error-free measurement chain with a specific excitation by means of a test signal,
e) a comparison of the actual representative number and the target representative number, with particular attention being paid to a difference between the actual representative number and the target representative number in the further course, whereby, if the difference is too large or one or more threshold value(s) are exceeded or not reached, the measurement chain is monitored to the extent that an (fault) reaction occurs, in particular the mechatronic system is switched off to a safe state.

The maximum permissible difference according to e) is determined depending on the application from the safety goals and the possible failure modes of the components.

The first phase is formulated in even more detail:
1.) a determination of a first noise energy of the measurement chain to be monitored, with no current to be measured flowing through the conductor to which the current sensor 5 to be monitored is assigned and no excitation of the measurement chain by means of a test signal takes place, i.e. the so-called background noise or electronic noise or inherent noise of the measurement chain is determined, i.e. the noise of the measurement chain that is caused or generated by the electrical components, and based on this, the determination of the first noise energy of the measurement chain to be monitored,
2.) a determination of a second noise energy of the measurement chain to be monitored, with no current to be measured flowing through the conductor to which the current sensor 5 to be monitored is assigned and the measurement chain being excited by means of a test signal, i.e. noise of the measurement chain being determined as a result of an excitation of the measurement chain by means of a test signal and, based on this, the determination of the second noise energy of the measurement chain to be monitored, 3.) a determination of a third noise energy of the measurement chain to be monitored, the second noise energy of the measurement chain being corrected as a function of the first noise energy of the measurement chain, i.e., the second noise energy of the measurement chain is reduced by the proportion according to the first noise energy, 4.) a determination or establishment of a fourth noise energy of the (fault-free) measurement chain based on a simulation, whereby it is determined how much energy is transmitted via a (fault-free) measurement chain mapped by means of a transfer function when the (fault-free) measurement chain is excited by a test signal (as per 2.)), it being assumed in this simulation that no current to be measured flows through the conductor to which the current sensor 5 to be monitored is assigned, alternatively instead of the simulation or calculation this determination can be based on an experiment, that is the determination of the fourth noise energy, as also described in detail above for d), 5.) a comparison/a contrasting of the third and the fourth noise energy, i.e., a possible deviation between the third and the fourth noise energy is quantified, 6.) deriving a conclusion from the comparison/contrasting of the third and fourth noise energy, i.e., depending on this comparison/contrasting the measurement chain is monitored and, in particular, an adequate reaction, e.g., a release for operation or continued operation of the system or a fault reaction, in particular switching off the mechatronic system to a safe state.

A respective representative number is preferably derived from the noise energy, i.e., from the first, second, third and fourth noise energy. This representative number is used for the correction according to 3.) and the comparison according to 5.). The representative number corresponds in particular to a signal norm. The representative number preferably corresponds to the 1-norm or the 2-norm.

With regard to the test signal, it should be emphasized again that it is in particular a pseudorandom binary sequence (PRBS), i.e., a binary signal that approximates the spectrum of white noise. This can be generated by means of a deterministic random number generator.

With regard to the ISO26262 standard already mentioned, it should be added that it describes that hardware elements, such as a switch/resistor, have certain failure modes, such as e.g. "permanently open", "permanently closed" or "resistance drift by 50%/200%." These failure modes are intended to be discovered by the diagnostics described herein.

In the second phase, i.e., after the start-up of the microcontroller 4, i.e. after booting, when the system or the control unit is no longer in idle and currents flow through the phases or the conductors surrounded by the current sensors 5, in other words during the operation of the microcontroller 4 or the underlying mechatronic system or the control unit, the test signal and useful signal are superimposed. This is shown in simplified form in FIG. 2. A phase current with pronounced harmonics H is superimposed on a broadband test signal T.

The advantage of a broadband excitation is that it can be better distinguished from the narrowband useful signal than if, in contrast, both the test signal and the useful signal were narrowband. A broadband excitation distributes the test signal over all partial frequency ranges, including those of the useful signal. However, only a small amount is excited per partial frequency range.

In contrast to the method before or during the start-up (first phase), the test signal is now pulsed, which can be ensured by a suitable operating strategy, i.e. in a first period of time the watchdog 8 or the noise generator 9 is used to generate a broadband test signal (PRBS, "white noise") is generated or output or a test signal is injected into the sensor 5 to be monitored, so that the test signal and useful signal, i.e. the test signal and the information or signals relating to the phase currents/phase voltages detected by means of the sensor 5 to be monitored (and of course also the inherent noise of the measurement chain) are superimposed, whereby the resulting noise (in total) is measured. In a second period of time, however, no test signal is generated or output by means of the watchdog 8 or the noise generator 9, or no test signal is injected into the sensor 5 to be monitored, so that only the useful signal, more precisely the sum of the useful signal and noise or inherent noise of the measurement chain, are being measured.

The first time period and the second time period preferably follow one another directly or are close to one another in terms of time.

In order to evaluate the characteristics of the measurement chain in the operating state, i.e. in the second phase (as a basis for monitoring the measurement chain), the noise energy in particular, preferably represented by a norm or representative number, for example the 2-norm, is used in the further course described in connection with the first phase (see above), is determined or calculated during the first and the second period.

In relation to the first and second period, an actual norm or actual representative number is determined, as described in connection with the first phase (see above), namely in that the norm or representative number that was determined during the idle state of the measurement chain to be monitored (see point a.) or 1.) above), is subtracted from the norm or representative number, which results in the first and second period from the test signal, the useful signal and the intrinsic noise (first period) and the useful signal and the inherent noise (second period) or was measured or calculated in this context.

In the further process, the actual norm or actual representative number relating to the second period is subtracted from the actual norm or actual representative number relating to the first period, so that the useful signal or the influence of the useful signal is eliminated. Consequently, the remaining actual norm or actual representative number only represents the influence of the test signal on the measurement chain to be monitored.

Furthermore, the method described above is used for the first phase, namely a target representative number or target norm is determined as per d) or a fourth noise energy of the (fault-free) measurement chain is determined as per 4.) by simulation or an experiment.

The same applies to steps e) or 5) and 6) of the method relating to the first phase, i.e., these are also carried out in the second phase. Accordingly, the following also takes place in the second phase:

according to e) a comparison of actual representative number and target representative number, in particular a difference between actual representative number and target representative number being considered in the further course, wherein if the difference is too large or exceeds or falls below threshold values, a (fault) reaction occurs, according to 5) and 6) a comparison of the third and the fourth noise energy and a conclusion derived from the comparison.

That is, step a) or 1.) is part of the process in the first and also in the second phase.

Figure 3:
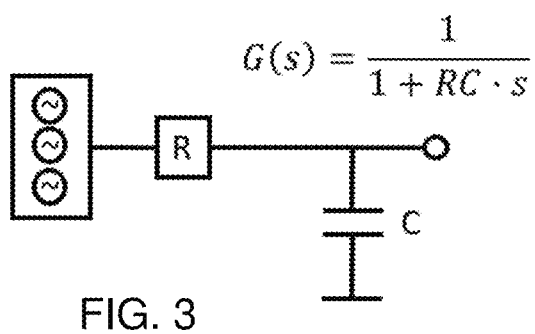
FIG. 3 shows a low pass filter.

The method will be demonstrated below using an example or a fault simulation. For this purpose, a simplified model of the measurement chain, a first-order low-pass behavior, is selected. As shown in simplified form in FIG. 3, this is implemented as an RC element with the transfer function $G(s)=1/(1+RC*s)$.

In a Matlab simulation, a noise signal is generated as an excitation. This test signal is switched in parallel to two different chains. The intact original track with R and C as well as the defective track with the failure mode "resistance R drift by a factor of 2" and the following transfer function $Gdef(s)=1/(1+2*RC*s)$.

As a result of the test signal, there are responses from the intact and the defective chain, with the changed behavior of the defective chain compared to the original chain showing up in the time domain (not shown) in the form of lower amplitudes.

Figure 4:
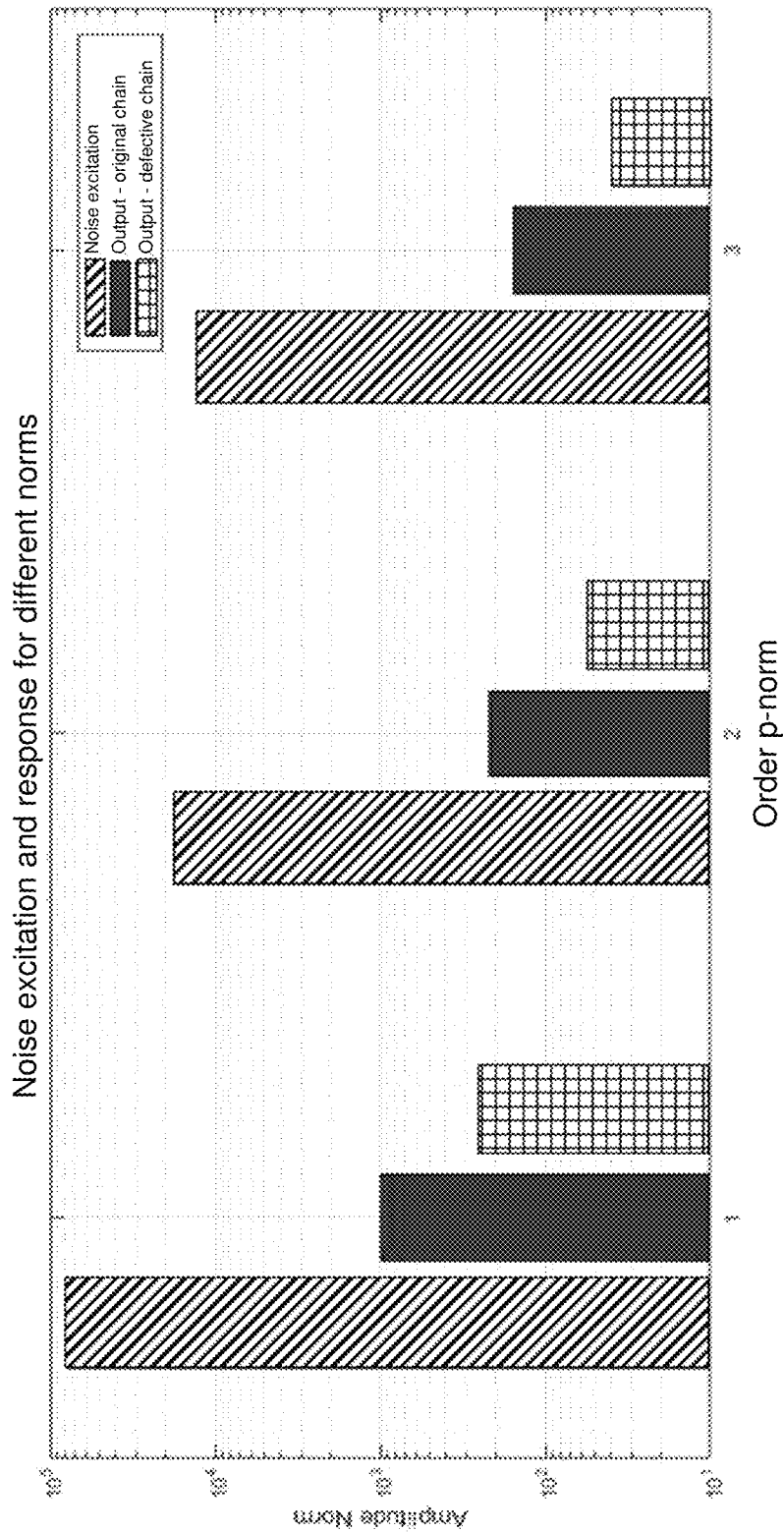
FIG. 4 shows a noise excitation response for different norms.

FIG. 4 shows different norms of the excitation and the two response signals. A clear difference can be seen here in all three norms between the original and the defective chain. In this simple example, any norm could be used. In a real example, all failure modes must be considered and then the norm with the best selectivity then be selected. It must also be noted that the higher the norm, the higher the computational effort. Therefore, the order of the norm should always be chosen as small as possible.

The approach described below is an extension which is not necessary for the method according to the disclosure with test signal injection but reduces the effects of the test signal injection on the useful functions such as current regulation. A PRBS noise generator produces a repeatable noise signal. This can be used to remove the added useful signal for downstream QM functions (such as current control) so that the signal-to-noise ratio is changed as little as possible by the test signal. For this purpose, the same PRBS generator (no reference number) is implemented in the microcontroller 4 and the phase relationship between the PRBS generator 9 in the watchdog 8 and in the microcontroller 4 is adjusted. The output signal of the PRBS generator (no reference number) in the microcontroller 4 is sent to a filter with the same dynamic and steady-state properties as those of the entire chain made up of the test signal amplification and measurement chain. The signal generated in this way in the microcontroller ideally corresponds to the test signal excitation. Therefore, the test signal for downstream functions can be removed again by subtraction. Small errors in the phase between the two test signals can be compensated for by correspondingly short averaging.

While the present invention has been described with reference to exemplary embodiments, it will be readily apparent to those skilled in the art that the invention is not limited to the disclosed or illustrated embodiments but, on the contrary, is intended to cover numerous other modifications, substitutions, variations and broad equivalent arrangements that are included within the spirit and scope of the following claims.

What is claimed is:

1. A method for monitoring a measurement chain including
a sensor,
electrical connections,
analog signal processing components, and
analog-to-digital conversion components, the method comprising:
   a) measuring an inherent noise of the measurement chain which is present without excitation of the measurement chain with a test signal;
   b) measuring an excitation noise of the measurement chain which results from excitation of the measurement chain with the test signal;
   c) subtracting the measured inherent noise from the measured excitation noise to derive a corrected excitation noise;
   d) determining a target noise of the measurement chain when fault-free which is caused by excitation of the measurement chain with the test signal when the sensor, the electrical connections, the analog signal processing components, and analog-to-digital conversion components are fault free and operating as intended;
   e) comparing the corrected excitation noise with the target noise; and
   f) monitoring the measurement chain depending on the outcome of comparing the corrected excitation noise with the target noise.

2. The method according to claim 1, wherein the sensor is a current sensor.

3. The method according to claim 1,
wherein the test signal is a binary signal that approximates the spectrum of white noise.

4. The method according to claim 1,
wherein measuring the inherent noise, measuring the excitation noise, and determining the target noise include deriving representative numbers, with the representative numbers being norms of measured signals.

5. The method according to claim 1,
wherein determining the target noise is performed by a simulation using a transfer function of the measurement chain when fault-free,
wherein the transfer function represents parameters of the sensor, the electrical connections, the analog signal processing components, and the analog-to-digital conversion components when fault-free.

6. The method according to claim 1,
wherein determining the target noise is performed by an experiment which includes determining an amount of energy being transmitted through the measurement chain when the measurement chain is known to be fault-free.

7. The method according to claim 1, wherein the measurement chain is part of a mechatronic system.

8. The method according to claim 7, wherein the monitoring of the measurement chain takes place either
before the mechatronic system is operated, with no superimposition of the test signal with a useful signal measured by the sensor during operation, or
during operation of the mechatronic system,
   with a useful signal being superimposed on the test signal,
   with the test signal being pulsed,
   with the measurement chain being excited with the test signal in a first period of time, so that the test signal, the inherent noise and the useful signal superimpose, this first noise that results from this superimposition of the measurement chain being measured, wherein in a second period of time the measurement chain is not excited with the test signal, so that only the inherent noise and the useful signal are superimposed, this second noise of the measurement chain being measured, wherein the measured inherent noise is subtracted from the first noise and from the second noise, wherein the second noise is also subtracted from the first noise in the further course whereby the useful signal is eliminated and a resulting noise is obtained, and wherein comparison of the resulting noise with the target noise is used for the monitoring of the measurement chain.

9. The method according to claim 7, wherein the measurement chain is monitored in that a reaction takes place, wherein the mechatronic system can be switched off to a safe state or a mechatronic system can be released for operation or continued operation.

10. A drive system, comprising:

a high-voltage battery;

a bridge inverter operatively connected to the high-voltage battery;

an electrical machine operatively connected to the bridge inverter;

a microcontroller operatively connected to the bridge inverter for controlling the electrical machine;

a measurement chain, including a current sensor configured to measure a current between the bridge inverter and the electrical machine, analog signal processing components operatively connected to the current sensor, and analog-to-digital conversion components operatively connected to the analog signal processing components and the microcontroller; and a watchdog, the watchdog being configured to perform the following steps:

a) measuring an inherent noise of the measurement chain which is present without excitation of the measurement chain with a test signal;

b) measuring an excitation noise of the measurement chain which results from excitation of the measurement chain with the test signal;

c) subtracting the measured inherent noise from the measured excitation noise to derive a corrected excitation noise;

d) determining a target noise of the measurement chain when fault-free which is caused by excitation of the measurement chain with the test signal when the sensor, the electrical connections, the analog signal processing components, and analog-to-digital conversion components are fault free and operating as intended;

e) comparing the corrected excitation noise with the target noise; and f) monitoring the measurement chain depending on the outcome of comparing the corrected excitation noise with the target noise.

11. The drive system according to claim 10, wherein the drive system is part of a vehicle.

* * * * *